(12) United States Patent
Kozuma et al.

(10) Patent No.: US 9,007,092 B2
(45) Date of Patent: Apr. 14, 2015

(54) SEMICONDUCTOR DEVICE

(71) Applicant: Semiconductor Energy Laboratory Co., Ltd., Atsugi-shi, Kanagawa-ken (JP)

(72) Inventors: Munehiro Kozuma, Kanagawa (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/217,628

(22) Filed: Mar. 18, 2014

(65) Prior Publication Data

US 2014/0285234 A1    Sep. 25, 2014

(30) Foreign Application Priority Data

Mar. 22, 2013 (JP) ................. 2013-059260

(51) Int. Cl.
*H03K 19/00* (2006.01)
(52) U.S. Cl.
CPC ................... *H03K 19/0013* (2013.01)
(58) Field of Classification Search
USPC ............... 326/37–41, 47, 63, 80–82
See application file for complete search history.

(56) References Cited

U.S. PATENT DOCUMENTS

| | | | |
|---|---|---|---|
| 5,633,601 A | 5/1997 | Nagaraj | |
| 5,731,856 A | 3/1998 | Kim et al. | |
| 5,744,864 A | 4/1998 | Cillessen et al. | |
| 5,801,934 A * | 9/1998 | Lacey et al. | 363/60 |
| 6,294,274 B1 | 9/2001 | Kawazoe et al. | |
| 6,400,211 B1 | 6/2002 | Yokomizo et al. | |
| 6,448,820 B1 * | 9/2002 | Wang et al. | 327/12 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Don Le
(74) *Attorney, Agent, or Firm* — Fish & Richardson P.C.

(57) ABSTRACT

To provide a charge pump circuit to manufacture a low-power-consumption PLD. A semiconductor device includes a first circuit and a second circuit electrically connected to the first circuit. A charge pump circuit formed of a transistor including an oxide semiconductor and a boosting control circuit controlling the charge pump circuit are provided between the first circuit and the second circuit. The first circuit and the charge pump circuit operate at first power supply voltage, and the boosting control circuit and the second circuit operate at second power supply voltage. The first power supply voltage is lower than the second power supply voltage.

21 Claims, 9 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,202 B2 | 10/2008 | Kimura et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 2001/0046027 A1 | 11/2001 | Tai et al. |
| 2002/0034082 A1 | 3/2002 | Yokomizo et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0232946 A1* | 11/2004 | Koo ................................ 326/81 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0216620 A1* | 9/2007 | Nagai et al. ................... 345/87 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0001259 A1 | 1/2010 | Saitho et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140609 A1 | 6/2010 | Yano et al. |
| 2011/0089414 A1 | 4/2011 | Yamazaki et al. |
| 2011/0101942 A1 | 5/2011 | Yamazaki et al. |
| 2012/0269013 A1 | 10/2012 | Matsuzaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-330943 A | 12/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

(56) References Cited

OTHER PUBLICATIONS

Park, Sang-Hee et al., "42.3: Transparent ZnO Thin Film Transistor for the Application of High Aperture Ratio Bottom Emission AMOLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with sputtered Al2O3 gate insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C." Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

(56) References Cited

OTHER PUBLICATIONS

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C." Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs with a Novel Passivation Layer," SID Digest '09 : SID International Symposium Digest of Technical Papers, May 31, 2009, pp. 284-287.

* cited by examiner

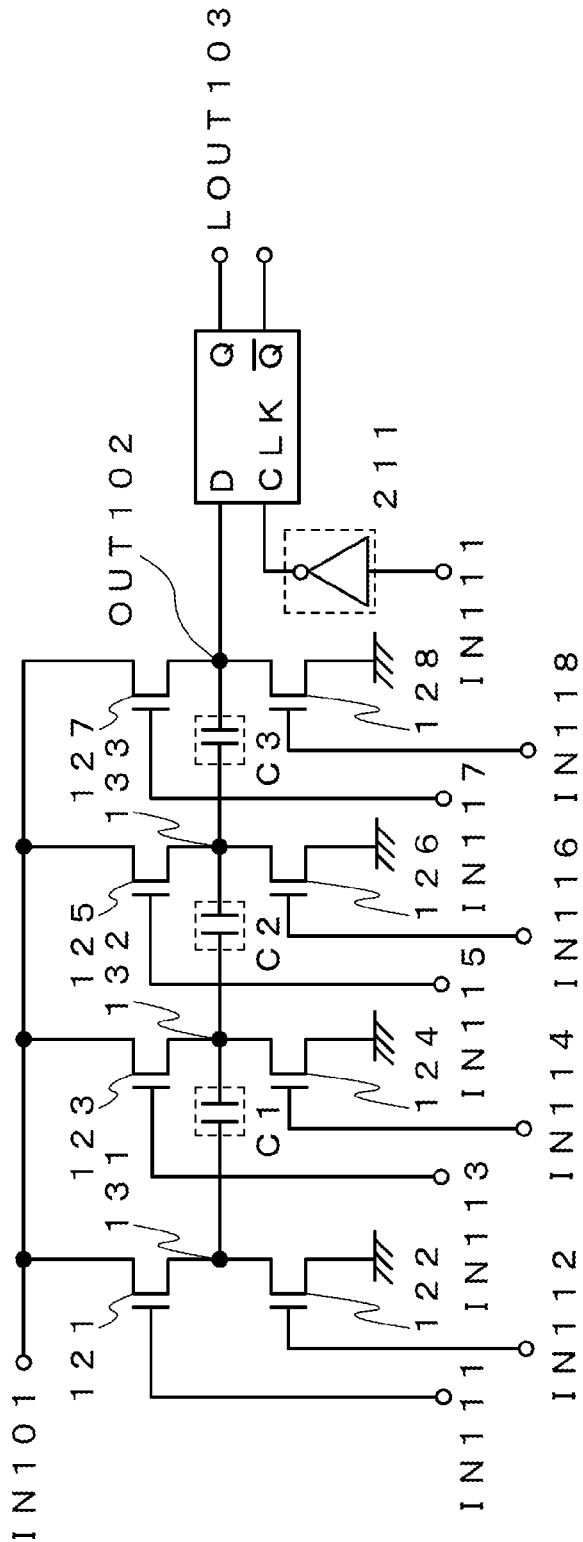
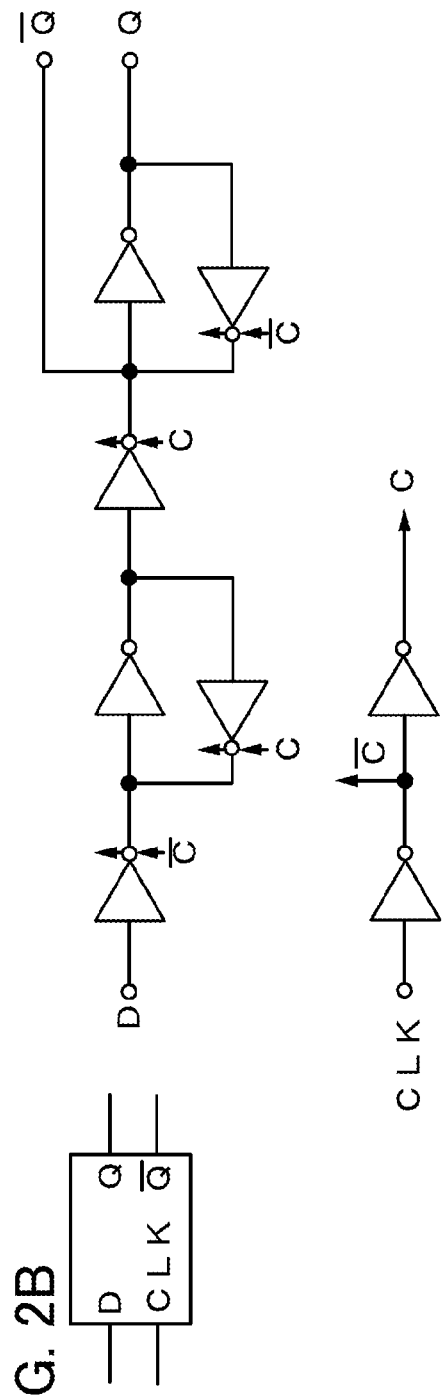
FIG. 2A
FIG. 2B

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example.

2. Description of the Related Art

In a programmable logic device (PLD), a logic circuit is formed using adequate-scale programmable logic elements (PLE), and the functions of the PLEs and connection between the PLEs can be changed after manufacture. Specifically, the PLD includes at least a plurality of PLEs and a routing resource for controlling connection between the PLEs.

There are a variety of PLE structures proposed by PLD vendors. A look-up table (LUT)-type PLE including an LUT that can function as a variety of logic gates with a simple circuit structure and a flip-flop required to achieve the function of a sequential circuit is advantageous over a product-term type PLE that achieves a desired logic gate with a combination of an AND circuit and an OR circuit in an increase in PLD area and comes on the market.

An LUT-type PLE often includes a multiplexer for offering an option for a signal path in addition to an LUT and a flip-flop. By providing the multiplexer in the PLE, configuration data can control not only PLE internal connection, such as selection of signals input to the flip-flop or selection of signals output from the PLE, but also direct connection between the PLEs without a routing resource switch. Thus, the use of the multiplexer can reduce the number of PLEs and achieve a variety of circuit structures in the PLD.

Patent Document 1 discloses a field programmable gate array (FPGA) including a plurality of multiplexers in a logic module.

REFERENCE

Patent Document

[Patent Document 1] Japanese Published Patent Application No. H8-330943

Such an FPGA is connected to an external circuit through an I/O terminal.

SUMMARY OF THE INVENTION

In a PLD (LSI), the power consumption of a circuit can be reduced by performing logic operation at a low voltage. Circuit dynamic power consumption P is represented by Formula 1. Note that α, f, n, $C_{load}$, and Vd mean an activation rate, operating frequency, the number of elements, element load capacitance, and power supply voltage, respectively.

$$P = \alpha \times f \times C_{load} \times Vd^2 \times n \quad \text{(Formula 1)}$$

Meanwhile, a signal output through an I/O terminal is required to be a voltage at a level similar to that of a voltage of an external circuit to compensate a stable circuit operation. Therefore, in general, a low-voltage signal of an internal circuit in a PLD is output to the external circuit after being increased to a voltage which is approximately equal to the voltage of an external circuit by using a DC-DC converter circuit such as a boosting circuit or a level shifter.

However, in the case where an internal voltage of a PLD is extremely low, an on-state current of a transistor used in the PLD is small; thus, high-speed operation cannot be performed. Accordingly, boosting operation takes a long time. Further, when a charge pump circuit that is a boosting circuit is formed using an FET including a Si semiconductor, charge during boosting operation which is held in a capacitor in the charge pump circuit is released as a leakage current, and boosting operation cannot be performed.

In view of the above technical background, it is an object of one embodiment of the present invention to provide a low-power PLD or the like in which operation speed can be prevented from decreasing. Alternatively, it is an object of one embodiment of the present invention to provide a low-power PLD or the like that can operate correctly. Alternatively, it is an object of one embodiment of the present invention to provide a semiconductor device or the like with a low off-state current. Alternatively, it is an object of one embodiment of the present invention to provide a semiconductor device or the like with a low flow-through current. Alternatively, it is an object of one embodiment of the present invention to provide a semiconductor device or the like in which operation speed is not decreased easily. Alternatively, it is an object of one embodiment of the present invention to provide a novel semiconductor device or the like. Note that the description of these objects does not disturb the existence of other objects. In one embodiment of the present invention, there is no need to achieve all the objects. Other objects will be apparent from and can be derived from the description of the specification, the drawings, the claims, and the like.

In one embodiment of the present invention, a charge pump circuit is used as a boosting circuit. The use of a charge pump circuit enables boosting without decreasing the operating frequency. Further, an FET including an oxide semiconductor (OS) is used as a transistor included in the charge pump circuit. An OS-FET can suppress generation of a leakage current. Thus, in a charge pump circuit where a storage capacitor is connected to an OS-FET, charge can be held in the storage capacitor for a long time. Consequently, stable boosting is possible even when the charge pump circuit operates at low speed. An OS-FET is not suitable for high-speed operation because the mobility of an OS-FET is lower than the mobility of a single-crystal Si-FET; however, an OS-FET can be used for a PLD of one embodiment of the present invention because the PLD operates at low speed.

In one embodiment of the present invention, an output signal of a charge pump circuit is held in a latch circuit because boosting operation of the charge pump circuit takes a long time. The latch signal can use a boosting end signal generated in a boosting circuit or an appropriate boosting control signal. When holding an output signal is completed in the latch circuit, boosting operation can be performed on an output signal from an internal circuit while a signal is output from the latch circuit to an external circuit through an I/O terminal. Consequently, output to the external circuit and boosting can be performed concurrently.

One embodiment of the present invention is a semiconductor device that includes a first circuit, a second circuit electrically connected to the first circuit, a charge pump circuit formed using a transistor including an oxide semiconductor between the first circuit and the second circuit, and a boosting control circuit controlling the charge pump circuit. The first circuit and the charge pump circuit operate at first power supply voltage, and the boosting control circuit and the second circuit operate at second power supply voltage. The first power supply voltage is lower than the second power supply voltage.

According to one embodiment of the present invention, in the above semiconductor device, the input operating frequency of the charge pump circuit is equal to the output operating frequency of the charge pump circuit.

According to one embodiment of the present invention, in the above semiconductor device, the charge pump circuit includes a capacitor having an electrical capacitance of higher than or equal to 10 fF and lower than or equal to 1 pF and outputs a boosting signal at a frequency of higher than or equal to 333 nHz and lower than or equal to 100 kHz.

According to one embodiment of the present invention, in the above semiconductor device, the first circuit includes a transistor formed in a silicon substrate and a transistor formed using an oxide semiconductor.

Another one embodiment of the present invention is a semiconductor device that includes first to fourth signal lines, an input signal line, an output signal line, a power supply line, first to fourth transistors, and a capacitor. A gate of the first transistor is electrically connected to the first signal line. A gate of the second transistor is electrically connected to the second signal line. A gate of the third transistor is electrically connected to the third signal line. A gate of the fourth transistor is electrically connected to the fourth signal line. One of a source and a drain of the first transistor is electrically connected to the input signal line, and the other of the source and the drain thereof is electrically connected to one of a source and a drain of the second transistor. The other of the source and the drain of the second transistor is electrically connected to the power supply line. One of a source and a drain of the third transistor is electrically connected to the input signal line, and the other of the source and the drain thereof is electrically connected to one of a source and a drain of the fourth transistor. The other of the source and the drain of the fourth transistor is electrically connected to the power supply line. A first terminal of the capacitor is electrically connected to the other of the source and the drain of the first transistor, and a second terminal of the capacitor is electrically connected to the other of the source and the drain of the third transistor. The other of the source and the drain of the third transistor is electrically connected to the output signal line. The first to fourth transistors each include an oxide semiconductor.

Another one embodiment of the present invention is a semiconductor device that includes first to fourth signal lines, an input signal line, an output signal line, a power supply line, first to fourth transistors, a capacitor, an inverter, and a latch circuit. A gate of the first transistor is electrically connected to the first signal line. A gate of the second transistor is electrically connected to the second signal line. A gate of the third transistor is electrically connected to the third signal line. A gate of the fourth transistor is electrically connected to the fourth signal line. One of a source and a drain of the first transistor is electrically connected to the input signal line, and the other of the source and the drain thereof is electrically connected to one of a source and a drain of the second transistor. The other of the source and the drain of the second transistor is electrically connected to the power supply line. One of a source and a drain of the third transistor is electrically connected to the input signal line, and the other of the source and the drain thereof is electrically connected to one of a source and a drain of the fourth transistor. The other of the source and the drain of the fourth transistor is electrically connected to the power supply line. A first terminal of the capacitor is electrically connected to the other of the source and the drain of the first transistor, and a second terminal of the capacitor is electrically connected to the other of the source and the drain of the third transistor. The other of the source and the drain of the third transistor is electrically connected to the output signal line. An input terminal of the inverter is electrically connected to the first signal line. A first input terminal of the latch circuit is electrically connected to the output signal line, and a second input terminal thereof is electrically connected to an output terminal of the inverter. The first to fourth transistors each include an oxide semiconductor.

According to one embodiment of the present invention, in a low-speed operation region where boosting is impossible by a conventional technique, boosting can be performed using a charge pump circuit. Further, a latch circuit holds an output potential in a period during which output from the charge pump circuit is stable, which enables supply of a stable high-voltage output signal to an external circuit. According to one embodiment of the present invention, signals can be constantly transmitted from the low-voltage side to the high-voltage side in low-speed operation.

BRIEF DESCRIPTION OF THE DRAWINGS

In the accompanying drawings:

FIGS. 2A and 2B are diagrams where a latch circuit is added to a charge pump circuit of one embodiment of the present invention;

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that a programmable logic device of one embodiment of the present invention includes, in its category, a variety of semiconductor integrated circuits formed using semiconductor elements, such as microprocessors, image processing circuits, controllers for semiconductor display devices, digital signal processors (DSP), microcontrollers, control circuits for batteries such as secondary batteries, and protection circuits. The semiconductor device of one embodiment of the present invention includes, in its category, a variety of devices such as RF tags formed using any of the semiconductor integrated circuits and semiconductor display devices. The semiconductor display device includes, in its category, liquid crystal display devices, light-emitting devices in which a light-emitting element typified by an organic light-emitting element (OLED) is provided in each pixel, electronic paper, digital micromirror devices (DMD), plasma display panels (PDP), field emission displays (FED), and other semiconductor display devices in which semiconductor elements are included in driver circuits.

Embodiment 1

Figure 1:
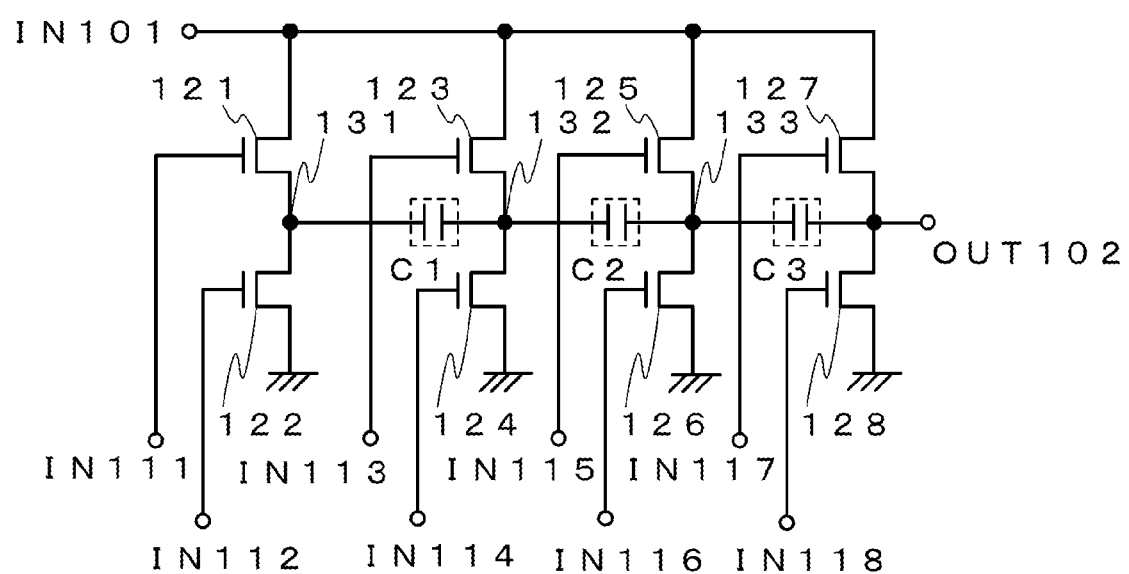
FIG. 1 is a circuit diagram of a charge pump circuit of one embodiment of the present invention.

A charge pump circuit of one embodiment of the present invention is illustrated in FIG. 1. FIG. 1 illustrates a charge pump circuit having four stages. The transistors in the drawing are OS-FETs. For the OS-FET, a semiconductor film having a wider band gap and lower intrinsic carrier density than silicon is used. A transistor in which a channel formation region is formed in such a semiconductor film has an extremely low off-state current and thus is preferably used. Examples of such a semiconductor are an oxide semiconductor and gallium nitride that have a band gap more than twice as wide as that of silicon. A transistor including the semiconductor can have a much lower off-state current than a transistor including a normal semiconductor such as silicon or germanium.

Since the OS-FET is an n-channel transistor, the charge pump circuit of one embodiment of the present invention is formed of n-channel transistors.

A source of a transistor means a source region that is part of a semiconductor film functioning as an active layer or a source electrode that is electrically connected to the semiconductor film. Similarly, a drain of a transistor means a drain region that is part of a semiconductor film functioning as an active layer or a drain electrode that is electrically connected to the semiconductor film. A gate means a gate electrode.

The terms "source" and "drain" of a transistor interchange with each other depending on the type of the channel of the transistor or levels of potentials applied to terminals. In general, in an n-channel transistor, a terminal to which a low potential is applied is called a source, and a terminal to which a high potential is applied is called a drain.

Note that in this specification, the term "connection" means electrical connection and corresponds to a state where current, voltage, or a potential can be supplied or transmitted. Accordingly, a connection state does not always mean a direct connection state but includes an electrical connection state through a circuit element such as a wiring, a resistor, a diode, or a transistor so that current, voltage, or a potential can be supplied or transmitted.

The structure of the charge pump circuit illustrated in FIG. 1 is described.

A gate of a transistor 127 is connected to an IN 117, one of a source and a drain of the transistor 127 is connected to an IN 101, and the other of the source and the drain of the transistor 127 is connected to an OUT 102 and one of terminals of a capacitor C3. A gate of a transistor 128 is connected to an IN 118, one of a source and a drain of the transistor 128 is connected to the OUT 102 and the one of the terminals of the capacitor C3, and the other of the source and the drain of the transistor 128 is connected to a ground potential (or a low power supply potential line).

A gate of a transistor 125 is connected to an IN 115, one of a source and a drain of the transistor 125 is connected to the IN 101, and the other of the source and the drain of the transistor 125 is connected to one of terminals of a capacitor C2 and the other of the terminals of the capacitor C3. A gate of a transistor 126 is connected to an IN 116, one of a source and a drain of the transistor 126 is connected to the one of the terminals of the capacitor C2 and the other of the terminals of the capacitor C3, and the other of the source and the drain of the transistor 126 is connected to a ground potential. Note that a node where the other of the source and the drain of the transistor 125 and the one of the source and the drain of the transistor 126 are connected to each other is referred to as a node 133.

A gate of a transistor 123 is connected to an IN 113, one of a source and a drain of the transistor 123 is connected to the IN 101, and the other of the source and the drain of the transistor 123 is connected to one of terminals of a capacitor C1 and the other of the terminals of the capacitor C2. A gate of a transistor 124 is connected to an IN 114, one of a source and a drain of the transistor 124 is connected to the one of the terminals of the capacitor C1 and the other of the terminals of the capacitor C2, and the other of the source and the drain of the transistor 124 is connected to a ground potential. Note that a node where the other of the source and the drain of the transistor 123 and the one of the source and the drain of the transistor 124 are connected to each other is referred to as a node 132.

A gate of a transistor 121 is connected to an IN 111, one of a source and a drain of the transistor 121 is connected to the IN 101, and the other of the source and the drain of the transistor 121 is connected to the one of the terminals of the capacitor C1. A gate of a transistor 122 is connected to an IN 112, one of a source and a drain of the transistor 122 is connected to the other of the terminals of the capacitor C1, and the other of the source and the drain of the transistor 122 is connected to a ground potential. Note that a node where the other of the source and the drain of the transistor 121 and the one of the source and the drain of the transistor 122 are connected to each other is referred to as a node 131.

The transistors 121, 123, 125, and 127 write a signal of the IN 101 to the capacitors C1, C2, and C3 (set a signal of the IN 101 at the capacitors C1, C2, and C3).

The transistors 122, 124, 126, and 128 write a ground potential to the capacitors C1, C2, and C3 (reset a ground potential at the capacitors C1, C2, and C3).

Each of the capacitors C1, C2, and C3 holds charge for boosting operation and performs boosting operation due to capacitive coupling.

A low-voltage input signal output from an internal circuit in a PLD is input to the IN 101. After potentials by which the transistors are turned on are input to the INs 118, 116, 114, and 112 and thus the OUT 102 is reset to a ground potential, the transistor 128 is turned off and then, a potential by which the transistor 127 is turned on is input to the IN 117. The potential of the OUT 102 becomes the same as that of the IN 101.

Next, after the transistors 127 and 126 are turned off, a potential by which the transistor 125 is turned on is input to the IN 115, so that the node 133 connected to the other of the terminals of the capacitor C3 has the same potential as the IN 101. Thus, the potential of the OUT 102 is increased and can be twice as high as that of the IN 101 at the maximum.

Next, when a potential by which the transistor 123 is turned on is input to the IN 113 after the transistors 125 and 124 are turned off, the potential of the node 132 connected to the other of the terminals of the capacitor C2 becomes the same as that of the IN 101. Thus, the potentials of the node 133 and the OUT 102 are increased. At the maximum, the potential of the node 133 becomes twice as high as that of the IN 101 and the potential of the OUT 102 becomes three times as high as that of the IN 101.

Finally, when a potential by which the transistor 121 is turned on is input to the IN 111 after the transistors 123 and 122 are turned off, the potential of the node 131 connected to the other of the terminals of the capacitor C1 becomes the same as that of the IN 101. Thus, the potentials of the nodes 132 and 133 and the OUT 102 are increased. At the maximum, the potential of the node 132 becomes twice as high as that of the IN 101, the potential of the node 133 becomes three times as high as that of the IN 101, and the potential of the OUT 102 becomes four times as high as that of the IN 101.

In this manner, the potential of an input signal can be raised by fourfold at the maximum without changing the operating frequency of the IN 101 and the operating frequency of the OUT 102.

Although the charge pump circuit having four stages is described in this embodiment, a charge pump circuit of one embodiment of the present invention is not particularly limited as long as having two or more stages.

Embodiment 2

FIG. 2A illustrates a structure example where a D-flip-flop (D-FF) circuit (latch circuit) is added to the charge pump circuit illustrated in FIG. 1. FIG. 2B illustrates a structure example of the D-FF circuit. Note that the present invention is not limited to the structure example in FIGS. 2A and 2B.

The structure illustrated in FIG. 2A is described. A data input line D of the D-FF circuit is connected to the OUT 102. An input terminal of an inverter 211 is connected to the IN 111. A clock input line CLK of the D-FF circuit is connected to an output terminal of the inverter 211.

The charge pump circuit boosts a low-voltage signal supplied to the IN 101 and outputs the signal to the OUT 102 as a high-voltage signal. Further, the D-FF circuit illustrated in FIG. 2B holds data by synchronizing a high-voltage signal of the OUT 102 with a rise in the CLK signal.

The D-FF circuit holds data (output signal) when the boosting operation is completed, and the charge pump circuit can boost the next input signal.

In the present invention, the timing when data of the D-FF circuit is written (latch) is the time when the signal of the IN 111 falls. In the case where the latch is performed when a high potential (high voltage) of the OUT 102 is input to the data input line D of the D-FF circuit, the high potential of the OUT 102 is held and thus, the high potential is output to an output terminal Q. Consequently, an LOUT 103 outputs the high potential.

In a period during which the D-FF circuit outputs the signal to the LOUT 103, the charge pump circuit can boost the output signal OUT 102 by the next latch timing; thus, data (output signal) can be output continuously.

The use of the above structure can prevent a decrease in operation speed due to the use of the charge pump circuit.

Embodiment 3

Figure 3:
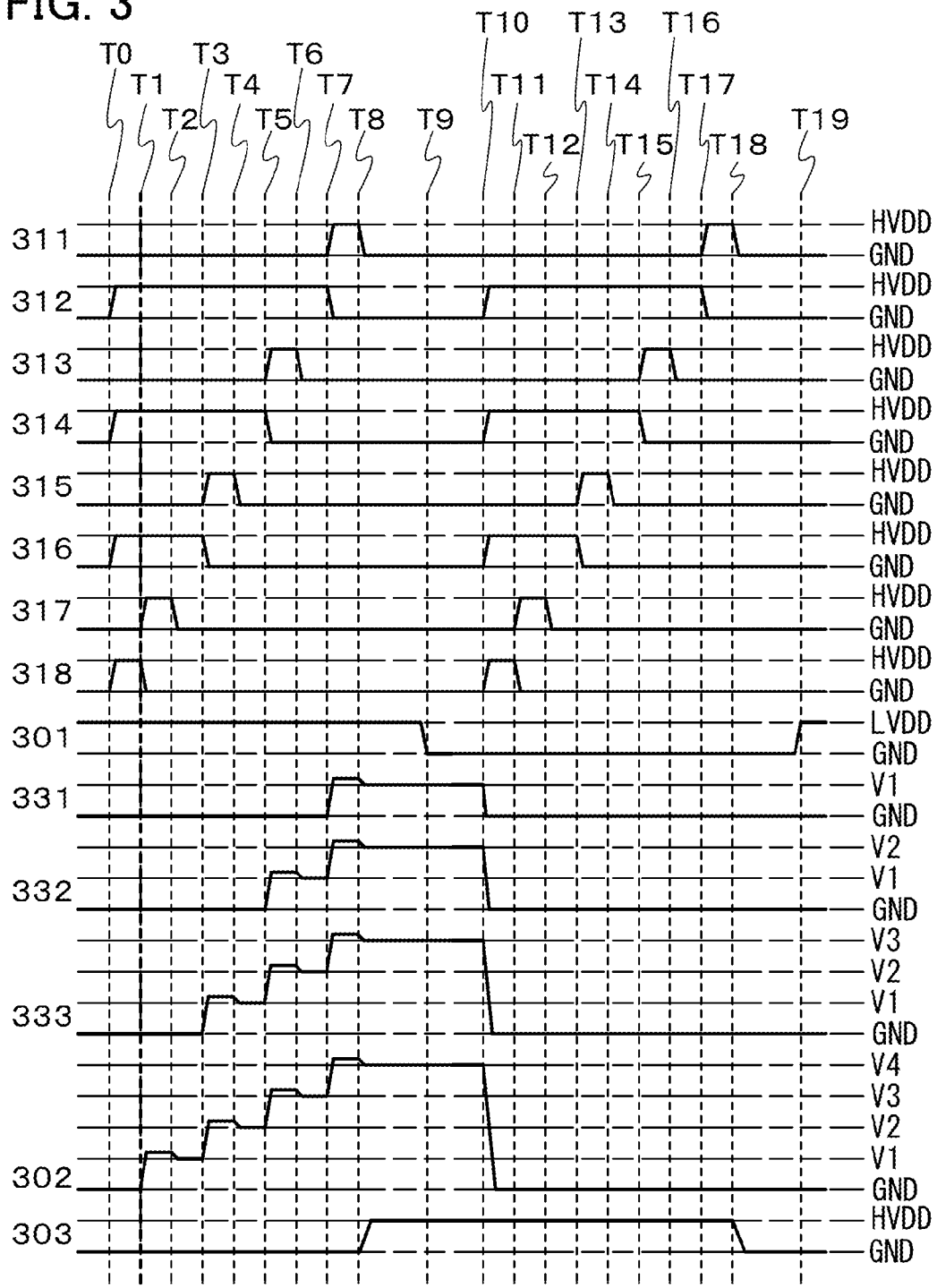
FIG. 3 is a timing chart of operation of a charge pump circuit of one embodiment of the present invention.

FIG. 3 is a timing chart of the charge pump circuit and the D-FF circuit that are illustrated in FIGS. 2A and 2B.

An operation example of the circuits in FIGS. 2A and 2B is described with reference to FIG. 3. FIG. 3 shows an example of the timing chart of the potentials of signals input to lines and the potentials of capacitors connected between transistors.

LVDD indicates a high potential of a low-voltage circuit, and HVDD indicates a high potential of a high-voltage circuit. GND indicates a low potential (low-voltage) of each of a low-voltage circuit and a high-voltage circuit. An input signal 301 is supplied to the IN 101 and input signals 311 to 318 are supplied to the INs 111 to 118, respectively. An output signal 302 indicates change over time in the OUT 102, an output signal 303 indicates change over time in the LOUT 103, a node potential 331 indicates change over time in the node 131, a node potential 332 indicates change over time in the node 132, and a node potential 333 indicates change over time in the node 133.

Immediately before Time T0, a signal of LVDD is supplied to the IN 101 and a signal of GND is supplied to the INs 111 to 118.

At Time T0, a signal of HVDD is supplied to the INs 112, 114, 116, and 118, so that the transistors 122, 124, 126, and 128 are turned on. Thus, GND is supplied to the nodes 131 to 133 and the OUT 102 through the transistors 122, 124, 126, and 128.

At Time T1, a signal of a low potential is supplied to the IN 118, so that the transistor 128 is turned off. Then, a signal of HVDD is supplied to the IN 117, so that the potential of the OUT 102 is raised to LVDD.

At Time T2, a signal of a low potential is supplied to the IN 117, so that the transistor 127 is turned off. Thus, the OUT 102 becomes a floating node. At that time, the potential of the OUT 102 is decreased owing to capacitive coupling of the gate capacitance of the transistors 127 and 128 and the capacitance of the capacitor C3, so that the OUT 102 becomes a potential of V1. Potential change caused by the capacitive coupling can be reduced by setting the electrical capacitance of the capacitor C3 to be sufficiently higher than the gate capacitance of the transistor 127. Since a signal of HVDD is supplied to the INs 112, 114, and 116, the nodes 131 to 133 are always in a reset state; thus, potential change caused by the capacitive coupling does not occur.

At Time T3, a signal of a low potential is supplied to the IN 116, so that the transistor 126 is turned off. Then, a signal of HVDD is supplied to the IN 115, so that the potential of the node 133 is raised to LVDD. At that time, the potential of the OUT 102 is also raised through the capacitor C3.

At Time T4, a signal of a low potential is supplied to the IN 115, so that the transistor 125 is turned off. Thus, the node 133 becomes a floating node. At that time, the potentials of the node 133 and the OUT 102 are decreased owing to capacitive coupling of the gate capacitance of the transistors 125 and 126 and the capacitance of the capacitors C2 and C3, so that the node 133 becomes a potential of V1 and the OUT 102 becomes a potential of V2. Potential change caused by the capacitive coupling can be reduced by setting the total amount of electrical capacitance of the capacitors C2 and C3 to be sufficiently higher than the gate capacitance of the transistor 125. Since a signal of HVDD is supplied to the INs 112 and 114, the nodes 131 and 132 are always in a reset state; thus, potential change caused by the capacitive coupling does not occur.

At Time T5, a signal of a low potential is supplied to the IN 114, so that the transistor 124 is turned off. Then, a signal of HVDD is supplied to the IN 113, so that the potential of the node 132 is raised to LVDD. At that time, the potential of the node 133 is raised through the capacitor C2, and the potential of the OUT 102 is raised through the capacitor C3.

At Time T6, a signal of a low potential is supplied to the IN 113, so that the transistor 123 is turned off. Thus, the node 132 becomes a floating node. At that time, the potentials of the nodes 132 and 133 and the OUT 102 are decreased owing to capacitive coupling of the gate capacitance of the transistors 123 and 124 and the capacitance of the capacitors C1 and C2, so that the node 132 becomes a potential of V1, the node 133 becomes a potential of V2, and the OUT 102 becomes a potential of V3. Potential change caused by the capacitive coupling can be reduced by setting the total amount of electrical capacitance of the capacitors C1 and C2 to be sufficiently higher than gate capacitance of the transistor 123. Since a signal of HVDD is supplied to the IN 112, the node 131 is always in a reset state; thus, potential change caused by the capacitive coupling does not occur.

At Time T7, a signal of a low potential is supplied to the IN 112, so that the transistor 122 is turned off. Then, a signal of HVDD is supplied to the IN 111, so that the potential of the node 131 is raised to LVDD. At that time, the potential of the node 132 is raised through the capacitor C1, the potential of the node 133 is also raised through the capacitor C2, and the potential of the OUT 102 is further also raised through the capacitor C3.

At Time T8, a signal of a low potential is supplied to the IN 111 and the transistor 121 is turned off, so that the node 131 becomes a floating node. At that time, the potentials of the nodes 131 to 133 and the OUT 102 are decreased owing to capacitive coupling of the gate capacitance of the transistors 121 and 122 and the capacitance of the capacitor C1, so that the node 131 becomes a potential of V1, the node 132 becomes a potential of V2, the node 133 becomes a potential of V3, and the OUT 102 becomes a potential of V4. Potential change caused by the capacitive coupling can be reduced by setting the total amount of electrical capacitance of the capacitor C1 to be sufficiently higher than the gate capacitance of the transistor 121. Since the potential V4 of the OUT 102 is in the range where a logic level is recognized as a high potential in the high-voltage circuit, the signal of the OUT 102 is latched as a high potential by the D-FF circuit. After the latch, a signal of HVDD is output to the LOUT 103. Since a signal supplied to the INs 111 to 118 is a low potential, the transistors 121 to 128 are kept off. Thus, the logic levels of the nodes 131 to 133 and the OUT 102 are not changed.

At Time T9, a signal of a low potential is supplied to the IN 101. Since a signal supplied to the INs 111 to 118 of the charge pump circuit keeps a low potential, the logic levels of the nodes 131 to 133 and the OUT 102 are not changed.

A period from Time T10 to Time T19 is different from a period from Time T0 to Time T9 in that the IN 101 holds a signal of a low potential. From Time T10 to Time T18, the nodes 131 to 133 and the OUT 102 always hold GND.

Since a low potential is held in each floating node at Time T18, a low potential of the OUT 102 is latched by the D-FF circuit. After the latch, a signal of GND is output to the LOUT 103. Since the INs 111 to 118 each hold a low potential, the transistors 121 to 128 are kept off. The logic levels of the nodes 131 to 133 and the OUT 102 are not changed.

At Time T19, a signal of LVDD is supplied to the IN 101. Since a signal supplied to the INs 111 to 118 of the charge pump circuit keeps a low potential, the logic levels of the nodes 131 to 133 and the OUT 102 are not changed.

As shown in FIG. 3, from Time T0 to Time T19, an input signal 301 supplied to the IN 101 can be boosted with a logic level kept, and the operating frequency of the output signal 303 in the LOUT 103 becomes the same as that of the input signal 301 supplied to the IN 101.

<Operation Speed>

In the following description, the transistors 121, 123, 125, and 127 illustrated in FIG. 1 and FIGS. 2A and 2B each can be referred to as a writing transistor. Further, the transistors 122, 124, 126, and 128 each can be referred to as a reset transistor.

A low-voltage circuit has a small Ion (on-state current) and thus has a low capability of supplying current to a capacitor. In general, an OS-FET has lower mobility than that of a Si-FET, and thus has a small on-state current. However, an OS-FET in a charge pump circuit can have sufficiently higher Ion of a low-voltage circuit than that of a Si-FET because a signal is supplied from a high-voltage circuit to a gate of the OS-FET. Therefore, the speed of writing to a capacitor is not affected by difference in mobility between a Si-FET and an OS-FET.

Since Si-FETs and OS-FETs have different off-state leakage currents, a retention period is determined by the amount of charge of a capacitor and the off-state leakage current of a reset transistor.

After charge is written to a capacitor through a writing transistor, a low potential is supplied to a gate of the writing transistor, so that capacitive coupling occurs between the gate capacitance of the writing transistor and the reset transistor and the capacitance of the capacitor. At that time, in the case where the capacitance of a capacitor is not sufficiently higher than the gate capacitance of the writing transistor, the potential of a floating node is decreased. When a decreased amount of potential is extremely large, boosting operation cannot be performed.

Here, when the gate capacitance of the writing transistor is higher than or equal to 1 fF and lower than or equal to 10 fF, the electrical capacitance of a capacitor is required to be higher than or equal to 10 fF and lower than or equal to 100 fF, which is 10 times as high as the above electrical capacitance, to reduce effects of capacitive coupling. In addition, in terms of increases in area and power consumption, the electrical capacitance can be 1 pF at the maximum. Thus, the electrical capacitance of the capacitor is required to be higher than or equal to 10 fF and lower than or equal to 1 pF.

In the charge pump circuit of one embodiment of the present invention, a high-potential voltage of an input signal can be higher than or equal to 0.1 V and lower than or equal to 0.5 V and a high-potential voltage after being boosted can be higher than or equal to 0.2 V and lower than or equal to 3.3 V. Accordingly, in the following description, the potential of the floating node is set to 3.3V. The relationship between the amount of charge Q and electrical capacitance C is represented by Q=CV, and a calculated value varies in proportion to a potential. Thus, the capacitor can hold a charge of higher than or equal to 33 fC and lower than or equal to 3.3 µC.

The off-state leakage current of a general Si-FET per channel width of 1 µm is approximately 1 pA/µm. However, a Si-FET used for an internal circuit in a PLD has a low threshold voltage to drive the internal circuit at a low voltage in some cases. Therefore, in a Si-FET manufactured in a process similar to that of an internal circuit in a PLD, an off-state leakage current of approximately 1 µA/µm flows in some cases. When the channel width of the Si-FET is 1 µm, the off-state leakage current of the Si-FET is higher than or equal to 1 pA and lower than or equal to 1 µA. With use of the amount of charge of the capacitor and the off-state leakage current of the Si-FET, the time for releasing all charge owing to the off-state leakage current is calculated to be longer than or equal to 30 ns and shorter than or equal to 3 s. Frequency into which the time is converted is higher than or equal to approximately 300 mHz and lower than or equal to 33 MHz, and when operation is performed at a frequency of higher than 33 MHz, a Si-FET can perform boosting operation. However, the frequency range in which an internal circuit in a PLD can operate is higher than or equal to 10 Hz and lower than or equal to 10 kHz, and a Si-FET does not have a sufficient capability.

On the other hand, the off-state leakage current of an OS-FET per channel width of 1 µm is lower than or equal to 1 aA/µm, and the time for releasing all charge owing to the off-state leakage current of 1 aA of the OS-FET per channel width of 1 µm is longer than or equal to $3 \times 10^4$ s and shorter than or equal to $3 \times 10^6$ s. Frequency into which the time is converted is higher than or equal to approximately 333 nHz and lower than or equal to 33 μHz, and when operation is performed at a frequency of higher than 33 μHz, an OS-FET can perform boosting operation. The OS-FET has a sufficient capability even compared with the frequency range in which the above internal circuit in the PLD can operate.

The charge pump circuit including an OS-FET of one embodiment of the present invention can stably operate in a low-speed operation range in which the capability of supplying current of a transistor is decreased at a low voltage (higher than or equal to 333 nHz and lower than or equal to 100 kHz, preferably higher than or equal to 33 μHz and lower than or equal to 100 kHz, more preferably higher than or equal to 10 Hz and lower than or equal to 10 kHz).

Embodiment 4

Figure 4:
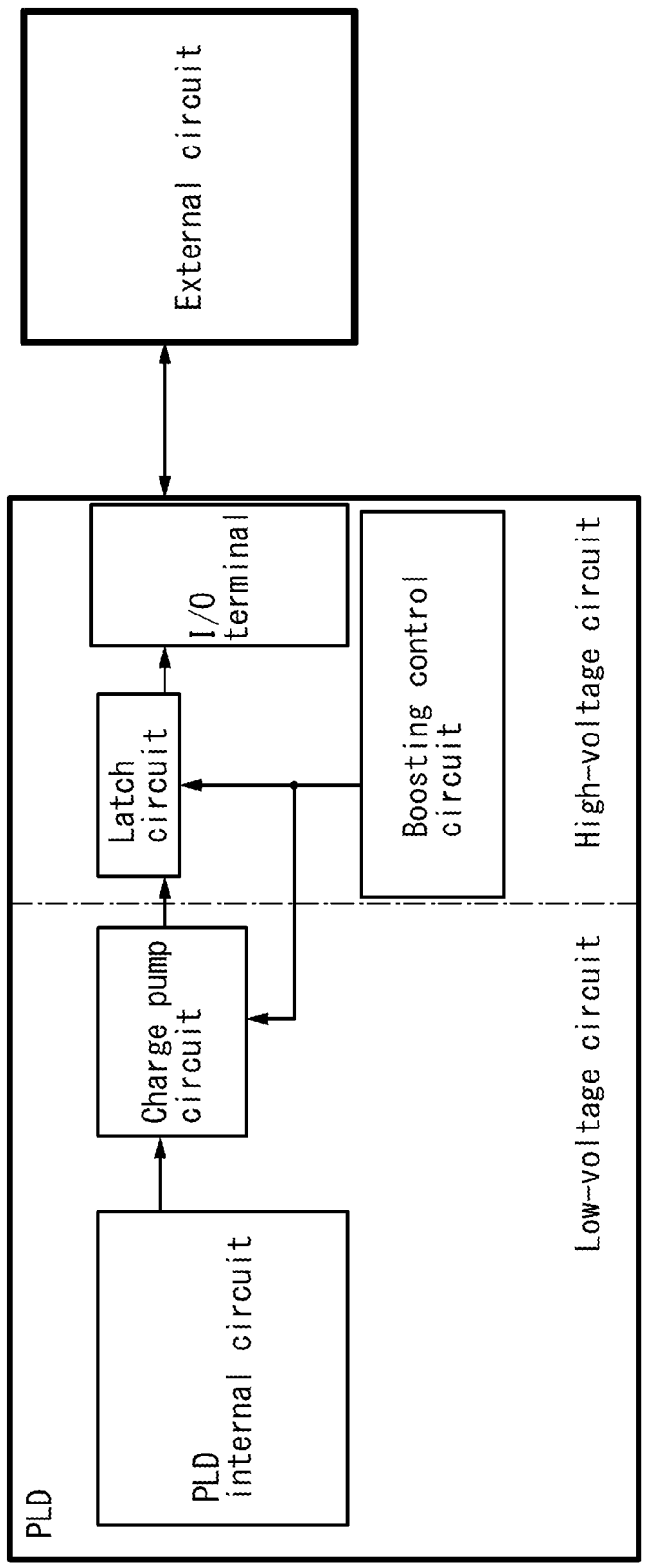
FIG. 4 illustrates the entire structure of a PLD including a charge pump circuit of one embodiment of the present invention.

FIG. 4 illustrates a general structure example of a PLD including the charge pump circuit of one embodiment of the present invention. An internal circuit in the PLD is formed of a low-voltage circuit, and an external circuit, an I/O terminal, and a boosting control circuit are each formed of a high-voltage circuit.

An output line of the internal circuit in the PLD is connected to a signal input line of the charge pump circuit. A control signal input line of the charge pump circuit is connected to an output line of the boosting control circuit.

A signal output from the internal circuit is input to the charge pump circuit. In the charge pump circuit, boosting operation is controlled by the boosting control circuit. Since a signal is input from the high-voltage circuit to the INs 111 to 118, the on-state current of an OS-FET in the charge pump circuit is larger than the on-state current of a transistor included in the internal circuit that is a low-voltage circuit.

Since an output signal after being boosted can be input to the high-voltage circuit, an output signal can be supplied to the latch circuit. When a boosting control signal (or boosting end signal) (e.g., IN 111) at the timing when boosting operation is completed is used as a latch signal, an output potential of the charge pump circuit is held in the latch circuit. The latch circuit outputs the held high-voltage signal to the I/O terminal and outputs the high-voltage signal to the external circuit connected to the I/O terminal.

<PLD Entire Structure>

Figure 5:
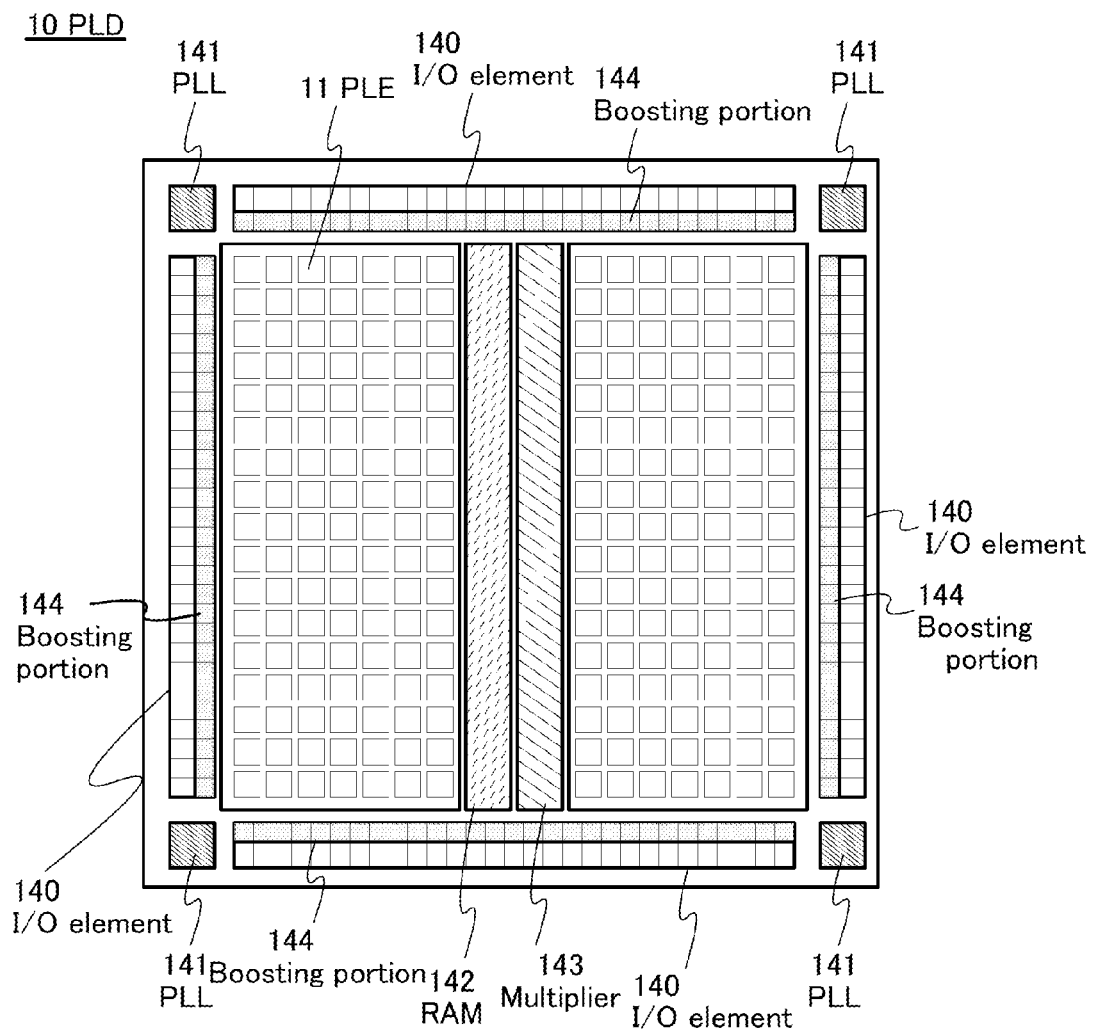
FIG. 5 illustrates the entire structure of a PLD.

FIG. 5 illustrates an example of the entire structure of a PLD 10. In FIG. 5, a PLE 11, I/O elements 140, phase lock loops (PLL) 141, a RAM 142, a multiplier 143, and a boosting portion 144 are provided in the PLD 10. The I/O element 140 functions as an interface that controls input and output of signals from and to an external circuit of the PLD 10. The boosting portion 144 has functions of boosting a low-voltage signal of the PLE 11 into a high-voltage signal as appropriate, and of outputting the high-voltage signal to the I/O elements 140. Note that the circuit in FIG. 1 or FIG. 2A can be used as the boosting portion 144. The PLL 141 has a function of generating a clock signal. The RAM 142 has a function of storing data used for logical operation. The multiplier 143 corresponds to a logic circuit for multiplication. When the PLD 10 has a function of executing multiplication, the multiplier 143 is not necessarily provided.

<Cross-Sectional Structure Example of PLD>

Figure 6:
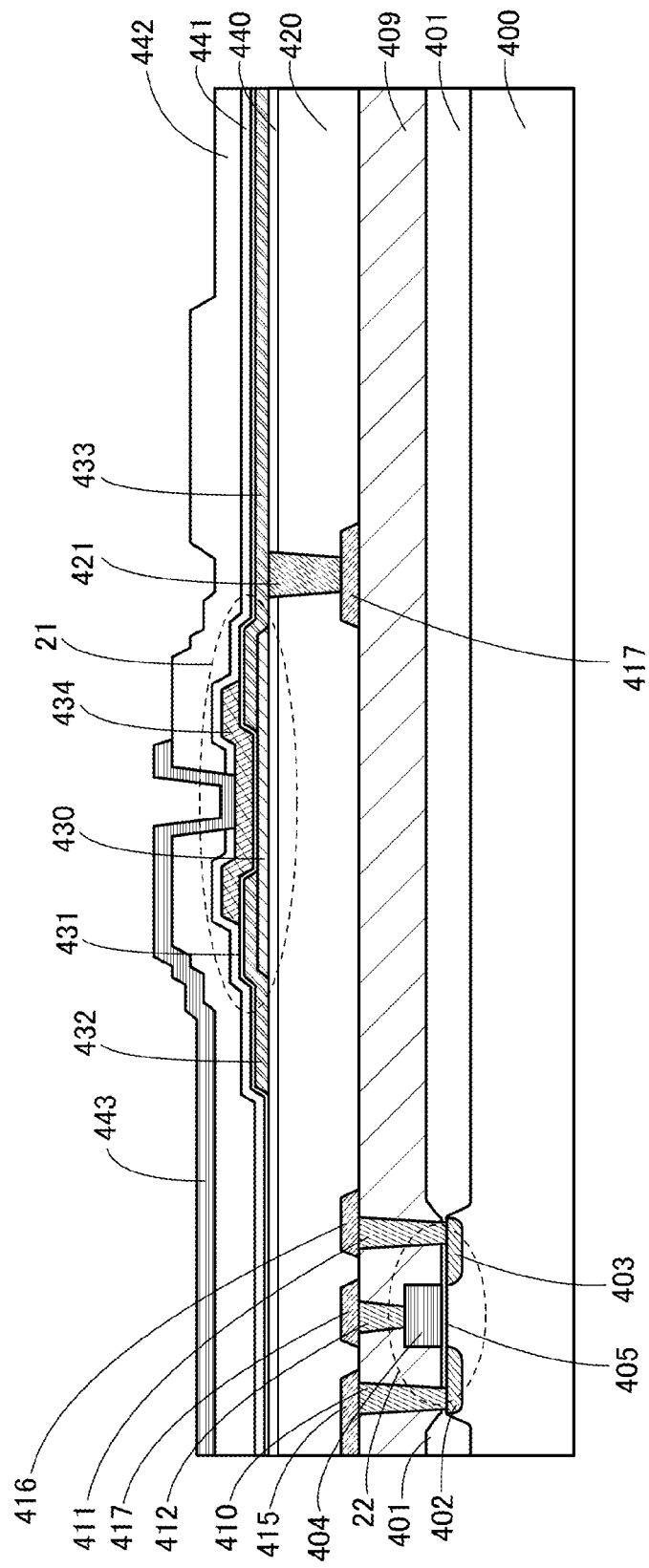
FIG. 6 illustrates a cross-sectional structure of a PLD.

FIG. 6 illustrates a cross-sectional structure example of a PLD of one embodiment of the present invention. In FIG. 6, the transistor 21 including a channel formation region in an oxide semiconductor film is formed over the transistor 22 including a channel formation region in a single-crystal silicon substrate.

Note that the transistor 22 can include a semiconductor film of silicon, germanium, or the like in an amorphous, microcrystalline, polycrystalline, or single crystal state for an active layer. Alternatively, the transistor 22 may include a channel formation region in an oxide semiconductor film. In the case where the transistors each include a channel formation region in an oxide semiconductor film, the transistor 21 is not necessarily stacked over the transistor 22, and the transistors 21 and 22 may be formed in the same layer.

In the case where the transistor 22 is formed using a silicon thin film, any of the following can be used: amorphous silicon formed by sputtering or vapor phase growth such as plasma-enhanced CVD; polycrystalline silicon obtained by crystallization of amorphous silicon by treatment such as laser annealing; single-crystal silicon obtained by separation of a surface portion of a single-crystal silicon wafer by implantation of hydrogen ions or the like into the silicon wafer; and the like.

A semiconductor substrate 400 where the transistor 22 is formed can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 6, a single-crystal silicon substrate having n-type conductivity is used.

The transistor 22 is electrically isolated from another transistor by an element isolation insulating film 401. The element isolation insulating film 401 can be formed by a local oxidation of silicon (LOCOS) method, a trench isolation method, or the like.

Specifically, the transistor 22 includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps with a channel formation region formed between the impurity regions 402 and 403 with the gate insulating film 405 positioned between the gate electrode 404 and the channel formation region.

An insulating film 409 is provided over the transistor 22. Openings are formed in the insulating film 409. Wirings 410 and 411 that are in contact with the impurity regions 402 and 403, respectively, and a wiring 412 that is electrically connected to the gate electrode 404 are formed in the openings.

The wiring 410 is electrically connected to a wiring 415 formed over the insulating film 409. The wiring 411 is electrically connected to a wiring 416 formed over the insulating film 409. The wiring 412 is electrically connected to a wiring 417 formed over the insulating film 409.

An insulating film 420 and an insulating film 440 are stacked in that order over the wirings 415 to 417. An opening is formed in the insulating film 420 and the insulating film 440. In the opening, a wiring 421 electrically connected to the wiring 417 is formed.

In FIG. 6, the transistor 21 is formed over the insulating film 440.

The transistor 21 includes, over the insulating film 440, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps with the semiconductor film 430 between the conductive films 432 and 433. Note that the conductive film 433 is electrically connected to the wiring 421.

An insulating film 441 and an insulating film 442 are stacked in that order over the transistor 21. An opening is formed in the insulating films 441 and 442. A conductive film 443 that is in contact with the gate electrode 434 in the opening is provided over the insulating film 441.

Note that in FIG. 6, the transistor 21 includes the gate electrode 434 on at least one side of the semiconductor film 430. Alternatively, the transistor 21 may include a pair of gate electrodes with the semiconductor film 430 positioned therebetween.

When the transistor 21 includes a pair of gate electrodes with the semiconductor film 430 positioned therebetween, a signal for controlling an on state or an off state of the transistor 21 may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential supplied to the other of the gate electrodes, the threshold voltage of the transistor can be controlled.

In FIG. 6, the transistor 21 has a single-gate structure where one channel formation region corresponding to one gate electrode 434 is provided. However, the transistor 21 may have a multi-gate structure where a plurality of channel formation regions are formed in one active layer by providing a plurality of gate electrodes electrically connected to each other.

<Oxide Semiconductor Film>

A highly purified oxide semiconductor (purified OS) obtained by reduction of impurities such as moisture or hydrogen that serve as electron donors (donors) and reduction of oxygen vacancies is an intrinsic (i-type) semiconductor or a substantially i-type semiconductor. Thus, a transistor including a channel formation region in a highly purified oxide semiconductor film has an extremely low off-state current and high reliability.

Specifically, various experiments can prove a low off-state current of a transistor including a channel formation region in a highly purified oxide semiconductor film. For example, even when an element has a channel width of $1 \times 10^6$ μm and a channel length of 10 μm, the off-state current can be lower than or equal to the measurement limit of a semiconductor parameter analyzer, i.e., lower than or equal to $1 \times 10^{-13}$ A, at a voltage (drain voltage) between a source electrode and a drain electrode of 1 V to 10 V. In that case, it can be seen that the off-state current standardized on the channel width of the transistor is lower than or equal to 100 zA/μm. In addition, a capacitor and a transistor were connected to each other and the off-state current was measured using a circuit in which electric charge flowing to or from the capacitor is controlled by the transistor. In the measurement, a highly purified oxide semiconductor film was used in the channel formation region of the transistor, and the off-state current of the transistor was measured from a change in the amount of electric charge of the capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly purified oxide semiconductor film in the channel formation region has a much lower off-state current than a crystalline silicon transistor.

Note that unless otherwise specified, in this specification, the off-state current of an n-channel transistor is current that flows between a source and a drain when the potential of the drain is higher than that of the source or that of a gate while the potential of the gate is 0 V or lower in the case of the potential of the source used as a reference. Alternatively, in this specification, the off-state current of a p-channel transistor is current that flows between a source and a drain when the potential of the drain is lower than that of the source or that of a gate while the potential of the gate is 0 V or higher in the case of the potential of the source used as a reference.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that an off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:

1:5 (=¼:⅛:⅝), or an oxide whose composition is in the neighborhood of the above composition is preferably used.

For example, with an In—Sn—Zn-based oxide, high mobility can be relatively easily obtained. However, even with an In—Ga—Zn-based oxide, mobility can be increased by lowering defect density in a bulk.

The structure of the oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film in cross-sectional TEM observation, spots (bright spots) indicating c-axis alignment are observed.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when θ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of atomic arrangement between different crystal parts in the nc-OS film. Thus, there is no regularity of atomic arrangement in the film as a whole. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in some cases in an electron diffraction pattern of the nc-OS film obtained by using an electron beam having a diameter larger than the diameter of a crystal part (for example, a beam diameter of 50 nm or more). Meanwhile, spots are observed in a nanobeam electron diffraction pattern of the nc-OS film obtained by using an electron beam having a probe diameter (e.g., ranging from 10 nm to 30 nm) close to or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of atomic arrangement between different crystal parts in the nc-OS film. Therefore, the nc-OS film has a higher density of defect states than the CAAC-OS film.

Accordingly, the nc-OS film has higher carrier density than the CAAC-OS film in some cases. An oxide semiconductor film with a high carrier density tends to have a high electron mobility. Therefore, a transistor using the nc-OS film has high field-effect mobility in some cases. The nc-OS film has a higher density of defect states than the CAAC-OS film, and thus may have a lot of carrier traps. Consequently, a transistor including the nc-OS film has larger variation in electrical characteristics and lower reliability than a transistor including the CAAC-OS film. Note that the nc-OS film can be formed easily as compared to the CAAC-OS film because the nc-OS film can be formed even when the amount of impurity contained therein is relatively large; thus, the nc-OS film is sometimes preferably used depending on the application. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystalline part. For example, the amorphous oxide semiconductor film does not have a specific state as in quartz.

In an image obtained with TEM, a crystal part cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has much higher carrier density than the nc-OS film in some cases. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Note that an oxide semiconductor film may be a stacked film including two or more films of an amorphous oxide semiconductor film, a microcrystalline oxide semiconductor film, and a CAAC-OS film, for example.

For example, a CAAC-OS film is deposited by sputtering with a polycrystalline metal oxide target. When ions collide with the target, a crystal region included in the target might be separated from the target along the a-b plane, and a sputtered particle having a plane parallel to the a-b plane (flat-plate-like or pellet-like sputtered particle) might be separated from the target. In that case, the flat-plate-like or pellet-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100° C. to 740° C., preferably 200° C. to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the molar ratio for mixing powder may be changed as appropriate depending on a target to be formed.

Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film that is in contact with an oxide semiconductor film is an oxide and Na diffuses into the insulating film. In addition, in the oxide semiconductor film, Na cuts or enters a bond between metal and oxygen that are included in an oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5×10^{16}/cm^3$ or less, more preferably $1×10^{16}/cm^3$ or less, still more preferably $1×10^{15}/cm^3$ or less. Similarly, the measurement value of a Li concentration is preferably $5×10^{15}/cm^3$ or less, more preferably $1×10^{15}/cm^3$ or less. Similarly, the measurement value of a K concentration is preferably $5×10^{15}/cm^3$ or less, more preferably $1×10^{15}/cm^3$ or less.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electrical characteristics of the transistor are likely to deteriorate as in the case of alkali metal or alkaline earth metal. Thus, the concentrations of silicon and carbon in the oxide semiconductor film are preferably low. Specifically, the measurement value of a C concentration or the measurement value of a Si concentration by secondary ion mass spectrometry is preferably $1×10^{18}/cm^3$ or less. In that case, the deterioration of the electrical characteristics of the transistor can be prevented, so that the reliability of the PLD or the semiconductor device can be improved.

Metal in the source electrode and the drain electrode extracts oxygen from the oxide semiconductor film depending on a conductive material used for the source electrode and the drain electrode. In that case, a region in the oxide semiconductor film that is in contact with the source electrode or the drain electrode becomes an n-type region due to generation of oxygen vacancies.

The n-type region serves as a source region or a drain region, resulting in a decrease in the contact resistance between the oxide semiconductor film and the source electrode or the drain electrode. Thus, by forming the n-type region, the mobility and on-state current of the transistor can be increased, so that a switch circuit including the transistor can operate at high speed.

Note that metal in the source electrode and the drain electrode might extract oxygen when the source electrode and the drain electrode are formed by sputtering or the like or might extract oxygen by heat treatment performed after the source electrode and the drain electrode are formed.

Further, the n-type region is easily formed by using a conductive material that is easily bonded to oxygen for the source electrode and the drain electrode. The conductive material can be, for example, Al, Cr, Cu, Ta, Ti, Mo, or W.

The oxide semiconductor film is not limited to a single-layer metal oxide film and may have a stacked structure of a plurality of metal oxide films. In a semiconductor film in which first to third metal oxide films are stacked sequentially, for example, each of the first and third metal oxide films is an oxide film that contains at least one of metal elements contained in the second metal oxide film and whose energy at the bottom of the conduction band is closer to the vacuum level than that of the second metal oxide film by 0.05 eV or more, 0.07 eV or more, 0.1 eV or more, or 0.15 eV or more and 2 eV or less, 1 eV or less, 0.5 eV or less, or 0.4 eV or less. The second metal oxide film preferably contains at least indium because carrier mobility is increased.

In the case where the transistor has the above semiconductor film, when an electric field is applied to the semiconductor film by application of voltage to a gate electrode, a channel region is formed in the second metal oxide film whose energy at the bottom of the conduction band is low in the semiconductor film. In other words, the third metal oxide film is provided between the second metal oxide film and the gate insulating film, so that a channel region can be formed in the second metal oxide film insulated from the gate insulating film.

Since the third metal oxide film contains at least one of the metal elements contained in the second metal oxide film, interface scattering hardly occurs at an interface between the second metal oxide film and the third metal oxide film. Thus, carriers are not easily inhibited from moving at the interface, which results in an increase in the field-effect mobility of the transistor.

When an interface state is formed at an interface between the second metal oxide film and the first metal oxide film, a channel region is also formed in a region close to the interface; thus, the threshold voltage of the transistor varies. However, since the first metal oxide film contains at least one of the metal elements contained in the second metal oxide film, an interface state is hardly formed at the interface between the second metal oxide film and the first metal oxide film. Accordingly, the above structure can reduce variations in the electrical characteristics of the transistor, such as the threshold voltage.

Further, it is preferable that a plurality of oxide semiconductor films be stacked so that an interface level due to impurities existing between the metal oxide films, which inhibits carrier flow, is not formed at the interface between the metal oxide films. This is because if impurities exist between the stacked metal oxide films, the continuity of the lowest conduction band energy between the metal oxide films is lost, and carriers are trapped or disappear by recombination in the vicinity of the interface. By reducing impurities existing between the films, a continuous junction (here, particularly a U-shape well structure whose lowest conduction band energy is changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering system) provided with a load lock chamber. Each chamber of the sputtering system is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of $-40°$ C. or lower, preferably $-80°$ C. or lower, more preferably $-100°$ C. or lower is used, so that entry of moisture or the like into the oxide semiconductor film can be prevented as much as possible.

For example, the first metal oxide film and/or the third metal oxide film can be an oxide film that contains aluminum, silicon, titanium, gallium, germanium, yttrium, zirconium, tin, lanthanum, cerium, or hafnium at a higher atomic ratio than the second metal oxide film. Specifically, the first metal oxide film and/or the third metal oxide film is preferably an oxide film with a content of any of the above elements 1.5 times or more, preferably 2 times or more, further preferably 3 times or more that of the second metal oxide film in an atomic ratio. The above element is strongly bonded to oxygen and thus has a function of suppressing generation of oxygen vacancies in the oxide film. Accordingly, the first metal oxide film and/or the third metal oxide film can be an oxide film in which oxygen vacancies are less likely to be generated than in the second metal oxide film.

Specifically, when both the second metal oxide film and the first or third metal oxide film are In—M—Zn-based oxide films and the atomic ratio of the first or third metal oxide film is $In:M:Zn=x_1:y_1:z_1$ and that of the second metal oxide film is $In:M:Zn=x_2:y_2:z_2$, the atomic ratios are set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. The atomic ratios are preferably set so that $y_1/x_1$ is 1.5 times or more, preferably 2 times or more, further preferably 3 times or more $y_2/x_2$. Here, in the second metal oxide film, $y_2$ is preferably larger than or equal to $x_2$ because the transistor can have stable electrical characteristics. Note that the field-effect mobility of the transistor is reduced when $y_2$ is 3 times or more $x_2$; accordingly, $y_2$ is preferably smaller than 3 times $x_2$.

The thickness of the first metal oxide film and the third metal oxide film ranges from 3 nm to 100 nm, preferably from 3 nm to 50 nm. The thickness of the second metal oxide film ranges from 3 nm to 200 nm, preferably from 3 nm to 100 nm, further preferably from 3 nm to 50 nm.

In the three-layer semiconductor film, the first to third metal oxide films can be amorphous or crystalline. Note that the transistor can have stable electrical characteristics when the second metal oxide film where a channel region is formed is crystalline; therefore, the second metal oxide film is preferably crystalline.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by sputtering is used as the first and third metal oxide films, a sputtering target that is an In—Ga—Zn-based oxide containing In, Ga, and Zn at an atomic ratio of 1:3:2 can be used to deposit the first and third metal oxide films. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, a sputtering target including a polycrystalline In—Ga—Zn-based oxide containing In, Ga, and Zn at an atomic ratio of 1:1:1 is preferably used to deposit the second metal oxide film. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portions of the semiconductor film in the transistor may be tapered or rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a PLD or a semiconductor device including the transistor. Further, when the semiconductor film including the stacked metal oxide films is used in the transistor, the n-type region particularly preferably reaches the second metal oxide film part of which is to be a channel region, in which case the mobility and on-state current of the transistor are further increased and higher-speed operation of the PLD or the semiconductor device is achieved.

Figure 9A:
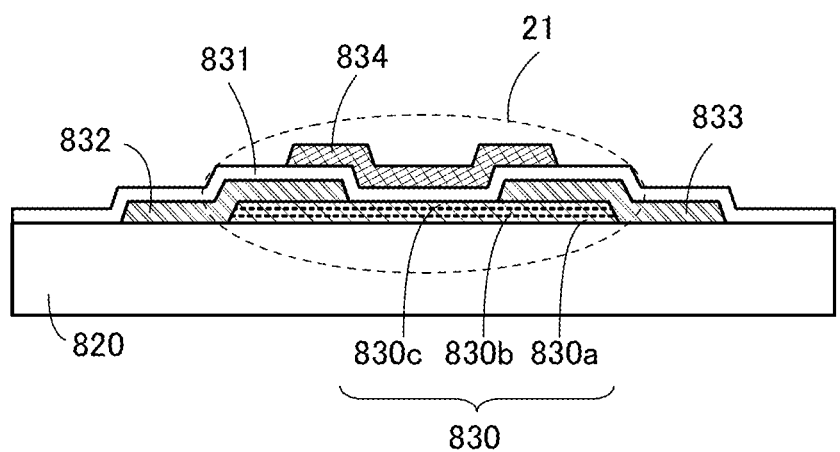
FIGS. 9A and 9B each illustrate a cross-sectional structure of a transistor.
Figure 9B:
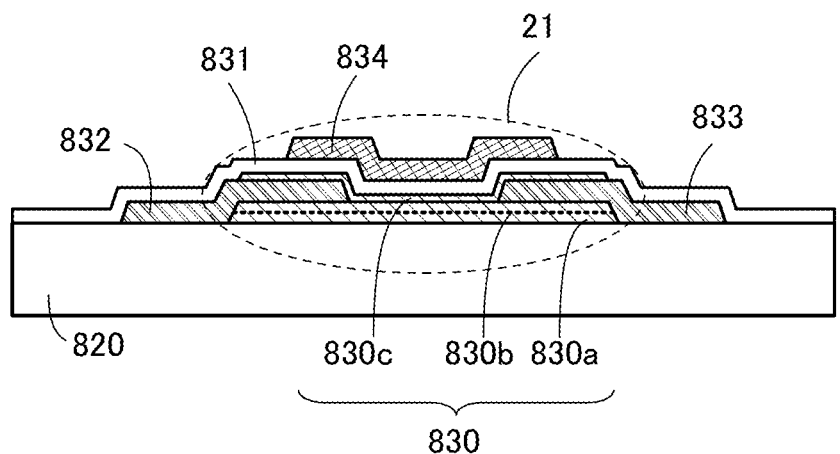

FIGS. 9A and 9B illustrate other cross-sectional structure examples of the transistor 21. The transistor 21 in FIG. 9A includes a semiconductor film 830 provided over an insulating film 820 and the like, conductive films 832 and 833 electrically connected to the semiconductor film 830, a gate insulating film 831, and a gate electrode 834 that is provided over the gate insulating film 831 to overlap with the semiconductor film 830.

The semiconductor film 830 is not necessarily a single oxide semiconductor film, but may be a stack of a plurality of oxide semiconductor films. FIG. 9A illustrates an example in which the semiconductor film 830 is formed using a stack of three oxide semiconductor films. Specifically, in the transistor 21 in FIG. 9A, oxide semiconductor films 830a to 830c are stacked sequentially from the insulating film 820 side as the semiconductor film 830.

Each of the oxide semiconductor films 830a and 830c is an oxide film that contains at least one of metal elements contained in the oxide semiconductor film 830b and whose energy at the bottom of the conduction band is closer to the vacuum level than that of the oxide semiconductor film 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor film 830b preferably contains at least indium because carrier mobility is increased.

Note that as illustrated in FIG. 9B, the oxide semiconductor film 830c may be provided over the conductive films 832 and 833 to overlap with the gate insulating film 831.

<Chip Structure>

Figure 7A:
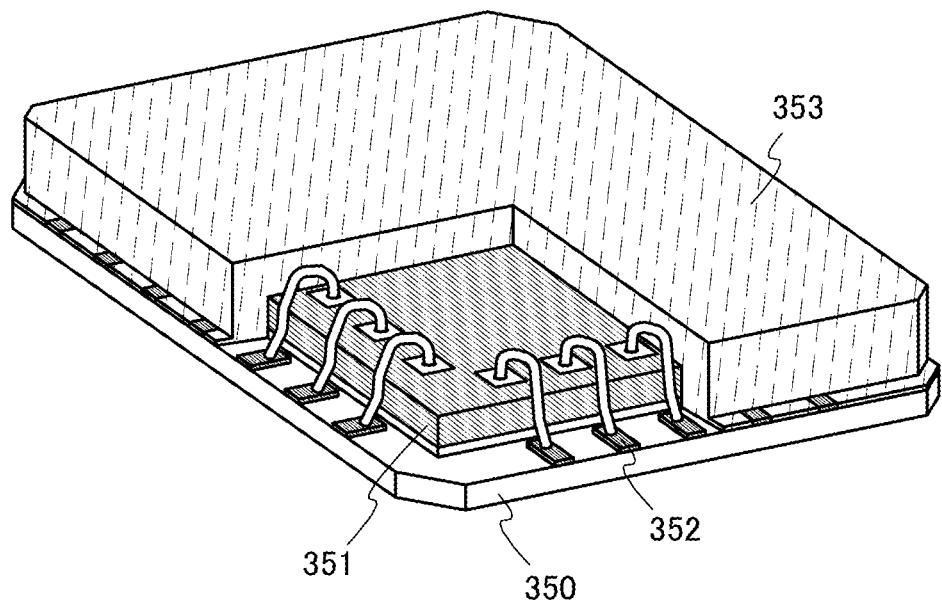
FIGS. 7A and 7B illustrate a chip and a module.

FIG. 7A is a perspective view illustrating a cross-sectional structure of a package including a lead frame interposer.

In the package in FIG. 7A, a chip 351 corresponding to the semiconductor device of one embodiment of the present invention is connected to a terminal 352 over an interposer 350 by wire bonding. The terminals 352 are placed on a surface of the interposer 350 on which the chip 351 is mounted. The chip 351 can be sealed by a mold resin 353 in which case the chip 351 is sealed so that part of each of the terminals 352 is exposed.

Figure 7B:
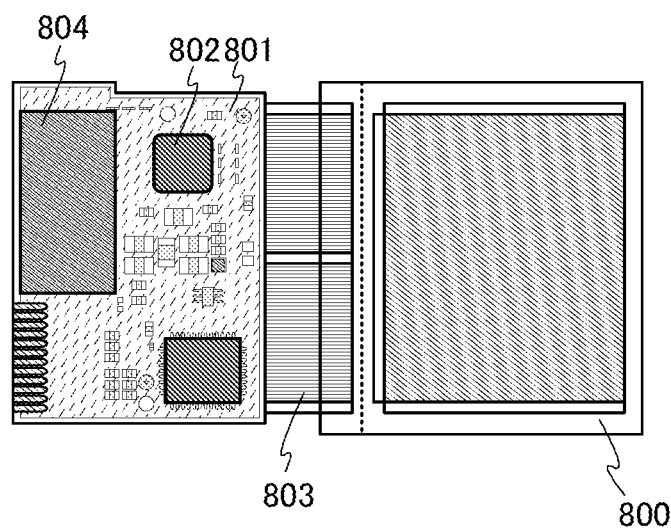

FIG. 7B illustrates the structure of a module of an electronic device in which the package is mounted on a circuit board.

In the module of a cellular phone in FIG. 7B, a package 802 and a battery 804 are mounted on a printed wiring board 801. In addition, the printed wiring board 801 is mounted on a panel 800 including display elements by an FPC 803.

<Examples of Electronic Device>

A semiconductor device or programmable logic device of one embodiment of the present invention can be used for display devices, personal computers, or image reproducing devices provided with recording media (typically, devices that reproduce the content of recording media such as digital versatile discs (DVD) and have displays for displaying the reproduced images). Further, as electronic devices that can include the semiconductor device or programmable logic device of one embodiment of the present invention, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 8A to 8F illustrate specific examples of these electronic devices.

Figure 8A:
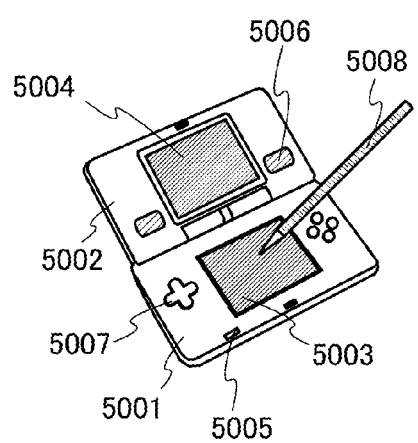
FIGS. 8A to 8F each illustrate an electronic device.

FIG. 8A illustrates a portable game machine, which includes a housing 5001, a housing 5002, a display portion 5003, a display portion 5004, a microphone 5005, speakers 5006, an operation key 5007, a stylus 5008, and the like. Note that although the portable game machine in FIG. 8A has the two display portions 5003 and 5004, the number of display portions included in the portable game machine is not limited thereto.

Figure 8B:
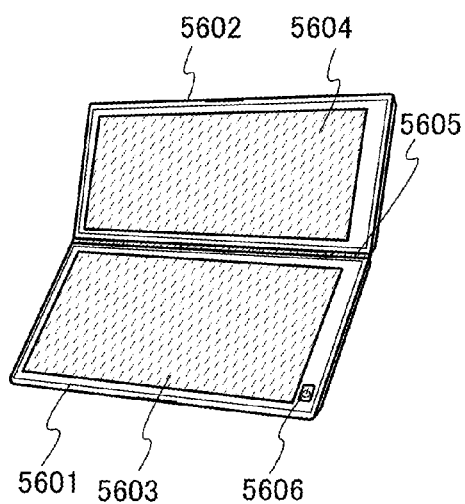

FIG. 8B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 8C:
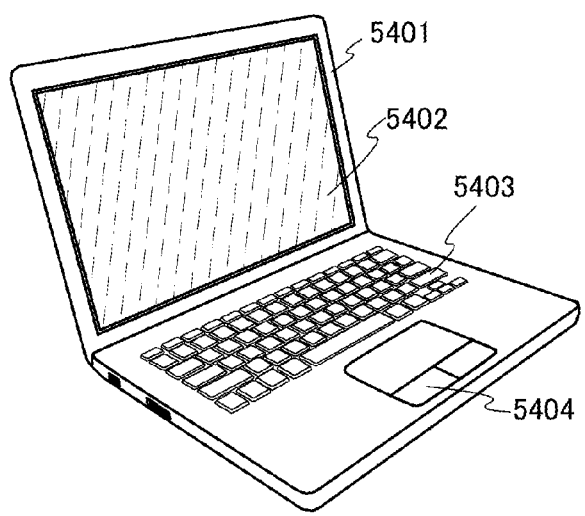

FIG. 8C illustrates a laptop, which includes a housing 5401, a display portion 5402, a keyboard 5403, a pointing device 5404, and the like.

Figure 8D:
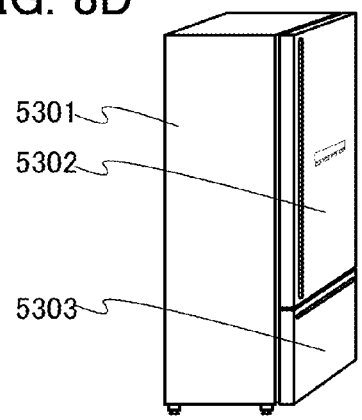

FIG. 8D illustrates an electric refrigerator-freezer, which includes a housing 5301, a refrigerator door 5302, a freezer door 5303, and the like.

Figure 8E:
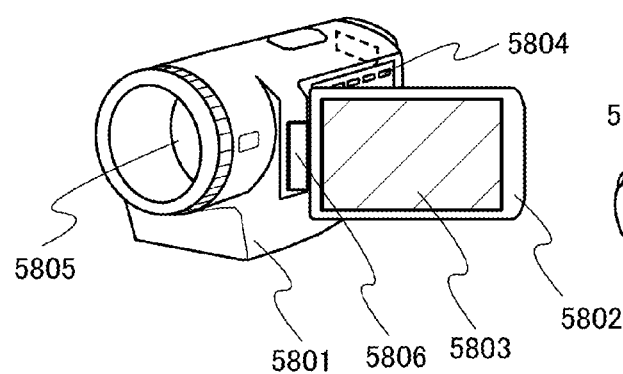

FIG. 8E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 8F:
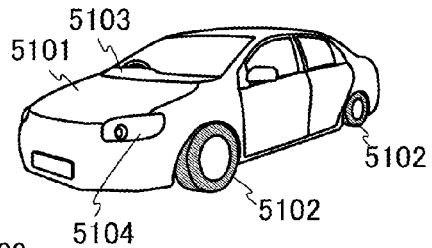

FIG. 8F illustrates an ordinary motor vehicle, which includes a car body 5101, wheels 5102, a dashboard 5103, lights 5104, and the like.

This application is based on Japanese Patent Application serial no. 2013-059260 filed with Japan Patent Office on Mar. 22, 2013, the entire contents of which are hereby incorporated by reference.

What is claimed is:

1. A semiconductor device comprising:
a first circuit to which a first potential is input, the first circuit outputting a second potential;
a second circuit electrically connected to the first circuit;
a charge pump circuit comprising a transistor including an oxide semiconductor film between the first circuit and the second circuit, the second potential is input to the charge pump circuit; and
a control circuit configured to control the charge pump circuit,
wherein a third potential is input to the control circuit,
wherein a fourth potential is input to the second circuit, and
wherein the first potential and the second potential are lower than the third potential and the fourth potential.

2. The semiconductor device according to claim 1, wherein input operating frequency of the charge pump circuit is equal to output operating frequency of the charge pump circuit.

3. The semiconductor device according to claim 1, wherein the charge pump circuit includes a capacitor having an electrical capacitance of higher than or equal to 10 fF and lower than or equal to 1 pF.

4. The semiconductor device according to claim 1, wherein the charge pump circuit outputs a boosting signal at a frequency of higher than or equal to 333 nHz and lower than or equal to 100 kHz.

5. The semiconductor device according to claim 1, wherein the first circuit includes a first transistor whose channel is provided in a silicon substrate and a second transistor including an oxide semiconductor.

6. The semiconductor device according to claim 1,
   wherein the first circuit includes a first transistor and a second transistor, and
   wherein each of the first transistor and the second transistor includes an oxide semiconductor.

7. The semiconductor device according to claim 1, wherein the semiconductor device is a programmable logic device.

8. The semiconductor device according to claim 1, wherein an electronic device includes the semiconductor device.

9. A semiconductor device comprising:
   first to fourth signal lines;
   an input signal line;
   an output signal line;
   a power supply line;
   first to fourth transistors; and
   a capacitor,
   wherein a gate of the first transistor is electrically connected to the first signal line,
   wherein a gate of the second transistor is electrically connected to the second signal line,
   wherein a gate of the third transistor is electrically connected to the third signal line,
   wherein a gate of the fourth transistor is electrically connected to the fourth signal line,
   wherein one of a source and a drain of the first transistor is electrically connected to the input signal line,
   wherein the other of the source and the drain of the first transistor is electrically connected to one of a source and a drain of the second transistor,
   wherein the other of the source and the drain of the second transistor is electrically connected to the power supply line,
   wherein one of a source and a drain of the third transistor is electrically connected to the input signal line,
   wherein the other of the source and the drain of the third transistor is electrically connected to one of a source and a drain of the fourth transistor,
   wherein the other of the source and the drain of the fourth transistor is electrically connected to the power supply line,
   wherein a first terminal of the capacitor is electrically connected to the other of the source and the drain of the first transistor,
   wherein a second terminal of the capacitor is electrically connected to the other of the source and the drain of the third transistor, and
   wherein the other of the source and the drain of the third transistor is electrically connected to the output signal line.

10. The semiconductor device according to claim 9, further comprising:
    an inverter; and
    a latch circuit,
    wherein an input terminal of the inverter is electrically connected to the first signal line,
    wherein a first input terminal of the latch circuit is electrically connected to the output signal line, and
    wherein a second input terminal of the latch circuit is electrically connected to an output terminal of the inverter.

11. The semiconductor device according to claim 9, wherein the capacitor has an electrical capacitance of higher than or equal to 10 fF and lower than or equal to 1 pF.

12. The semiconductor device according to claim 9, wherein the output signal line has a signal at a frequency of higher than or equal to 333 nHz and lower than or equal to 100 kHz.

13. The semiconductor device according to claim 9, wherein each of the first to fourth transistors includes a semiconductor film having a wider band gap than silicon and lower carrier density than silicon.

14. The semiconductor device according to claim 9, wherein the semiconductor device is included in a programmable logic device.

15. The semiconductor device according to claim 9, wherein an electronic device includes the semiconductor device.

16. A semiconductor device comprising:
    first to fourth signal lines;
    an input signal line;
    an output signal line;
    a power supply line;
    first to fourth transistors; and
    a capacitor,
    wherein a gate of the first transistor is electrically connected to the first signal line,
    wherein a gate of the second transistor is electrically connected to the second signal line,
    wherein a gate of the third transistor is electrically connected to the third signal line,
    wherein a gate of the fourth transistor is electrically connected to the fourth signal line,
    wherein one of a source and a drain of the first transistor is electrically connected to the input signal line,
    wherein the other of the source and the drain of the first transistor is electrically connected to one of a source and a drain of the second transistor,
    wherein the other of the source and the drain of the second transistor is electrically connected to the power supply line,
    wherein one of a source and a drain of the third transistor is electrically connected to the input signal line,
    wherein the other of the source and the drain of the third transistor is electrically connected to one of a source and a drain of the fourth transistor,
    wherein the other of the source and the drain of the fourth transistor is electrically connected to the power supply line,
    wherein a first terminal of the capacitor is electrically connected to the other of the source and the drain of the first transistor,
    wherein a second terminal of the capacitor is electrically connected to the other of the source and the drain of the third transistor,
    wherein the other of the source and the drain of the third transistor is electrically connected to the output signal line, and
    wherein the first to fourth transistors each include an oxide semiconductor.

17. The semiconductor device according to claim 16, further comprising:
- an inverter; and
- a latch circuit,
  - wherein an input terminal of the inverter is electrically connected to the first signal line,
  - wherein a first input terminal of the latch circuit is electrically connected to the output signal line, and
  - wherein a second input terminal of the latch circuit is electrically connected to an output terminal of the inverter.

18. The semiconductor device according to claim 16, wherein the capacitor has an electrical capacitance of higher than or equal to 10 fF and lower than or equal to 1 pF.

19. The semiconductor device according to claim 16, wherein the output signal line has a signal at a frequency of higher than or equal to 333 nHz and lower than or equal to 100 kHz.

20. The semiconductor device according to claim 16, wherein the semiconductor device is included in a programmable logic device.

21. The semiconductor device according to claim 16, wherein an electronic device includes the semiconductor device.

* * * * *